United States Patent
Lee et al.

(10) Patent No.: US 8,106,394 B2
(45) Date of Patent: Jan. 31, 2012

(54) MULTI-LAYER STORAGE NODE, RESISTIVE RANDOM ACCESS MEMORY DEVICE INCLUDING A MULTI-LAYER STORAGE NODE AND METHODS OF MANUFACTURING THE SAME

(75) Inventors: Jung-hyun Lee, Suwon-si (KR); Sang-jun Choi, Yongin-si (KR); Hyung-jin Bae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 241 days.

(21) Appl. No.: 12/314,835

(22) Filed: Dec. 17, 2008

(65) Prior Publication Data
US 2009/0194764 A1 Aug. 6, 2009

(30) Foreign Application Priority Data
Jan. 7, 2008 (KR) .................. 10-2008-0001823

(51) Int. Cl.
*H01L 29/68* (2006.01)
(52) U.S. Cl. .................... 257/42; 257/E29.17
(58) Field of Classification Search ............. 257/42, 257/E29.17
See application file for complete search history.

(56) References Cited

U.S. PATENT DOCUMENTS

| | | | |
|---|---|---|---|
| 2003/0186504 A1 | 10/2003 | Li et al. | |
| 2004/0051157 A1* | 3/2004 | Moore | 257/489 |
| 2004/0211957 A1* | 10/2004 | Moore et al. | 257/42 |
| 2006/0104106 A1* | 5/2006 | Aratani et al. | 365/148 |
| 2006/0231824 A1* | 10/2006 | Campbell | 257/4 |
| 2007/0090354 A1* | 4/2007 | Campbell | 257/42 |
| 2007/0108431 A1 | 5/2007 | Chen et al. | |
| 2007/0164398 A1 | 7/2007 | Li et al. | |
| 2008/0006810 A1* | 1/2008 | Park et al. | 257/4 |

FOREIGN PATENT DOCUMENTS

| KR | 1020060082038 A | 7/2006 |
|---|---|---|
| KR | 1020060122271 A | 11/2006 |

* cited by examiner

*Primary Examiner* — Victor Mandala
(74) *Attorney, Agent, or Firm* — Harness, Dickey & Pierce, P.L.C.

(57) ABSTRACT

A multi-layer storage node, resistive random access memory device and methods of manufacturing the same are provided. The resistive random access memory device includes a switching structure and a storage node connected to the switching structure. The storage node includes a lower electrode, a first layer, a second layer, and an upper electrode that may be sequentially stacked. The first layer may be formed on the lower electrode and includes at least one of oxygen (O), sulfur (S), selenium (Se), tellurium (Te) and combinations thereof. The second layer may be formed on the first layer and includes at least one of copper (Cu), silver (Ag) and combinations thereof. The second layer may be formed of a material having an oxidizing power less than that of the first layer. The upper electrode may be formed on the second layer.

20 Claims, 5 Drawing Sheets

MULTI-LAYER STORAGE NODE, RESISTIVE RANDOM ACCESS MEMORY DEVICE INCLUDING A MULTI-LAYER STORAGE NODE AND METHODS OF MANUFACTURING THE SAME

PRIORITY STATEMENT

This application claims the benefit of priority under 35 U.S.C. §119 from Korean Patent Application No. 10-2008-0001823, filed on Jan. 7, 2008, in the Korean Intellectual Property Office, the disclosure of which is incorporated herein in its entirety by reference.

BACKGROUND

1. Field

Example embodiments relate to a storage node, a semiconductor device and methods of manufacturing the same. Other example embodiments relate to a multi-layer storage node, a resistive random access memory device including a multi-layer storage node and methods of manufacturing the same.

2. Description of the Related Art

In a semiconductor memory cell array, many memory cells may be connected through a desired circuit structure. In general, each memory cell of a dynamic random access memory (DRAM) includes a switch and a capacitor. DRAMs may be highly integrated, rapid memory devices. DRAMs do not retain data when power is cut off.

A flash memory is a representative example of nonvolatile memory devices capable of retaining data even after power is cut off. Although the flash memory is nonvolatile, the flash memory may not be as highly integrated and/or may have a lower operating speed compared to DRAMs.

For thus reasons, research has been conducted for developing other nonvolatile memory devices (e.g., magnetic random access memories (MRAMs), ferroelectric random access memories (FRAMs) and phase-change random access memories (PRAMs)) that exhibit the desired semiconductor characteristics.

MRAMs store data using variations in the magnetization direction at tunnel junctions. FRAMs store data using polarization characteristics of ferroelectricity. Research on ways to increase the integration level, increase the operating speed, increase the data retention characteristics, and/or decrease the power consumption characteristics of MRAMs and FRAMs is being conducted.

PRAMs store data using resistance variations caused by phase changes of specific materials. In general, each cell of a PRAM includes a resistor and a switch (a transistor). PRAMs may be fabricated using DRAM manufacturing equipment. Using DRAM manufacturing equipment to fabricate PRAMs may be difficult and/or takes additional time to etch. As such, the cost per device increases due to a low productivity, making it difficult to manufacture competitive products.

In general, each cell of a resistive random access memory (RRAM) includes a storage node in which a lower electrode, a resistive layer and an upper electrode may be sequentially stacked. The resistance of the resistive layer varies according to an applied voltage. The PRAM is a nonvolatile memory device that may have a more rapid operating speed. Various PRAMs are currently being researched.

SUMMARY

Example embodiments relate to a storage node, a semiconductor device and methods of manufacturing the same. Other example embodiments relate to a multi-layer storage node, a resistive random access memory device including a multi-layer storage node and methods of manufacturing the same.

Example embodiments provide a resistive random access memory device having a more stable operational voltage and/or on/off resistance ratio.

According to example embodiments, there is provided a resistive random access memory device including a switching structure and a storage node connected to the switching structure. The storage node may include a lower electrode, a first layer formed on the lower electrode and including at least one of oxygen (O), sulfur (S), selenium (Se), tellurium (Te) and combinations thereof, a second layer formed on the first layer and including at least one of copper (Cu), silver (Ag) and combinations thereof, the second layer being formed of a material having an oxidizing power (or electronegativity) less than that of the first layer, and an upper electrode formed on the second layer.

The first layer may include at least one of transition metals, lanthanides and combinations thereof. The first layer may include a transition metal oxide. The second layer may include a germanium-tellurium-copper (GeTeCu) compound.

The switching structure may be a diode or transistor.

BRIEF DESCRIPTION OF THE DRAWINGS

Example embodiments will be more clearly understood from the following detailed description taken in conjunction with the accompanying drawings.

FIG. 1 is a diagram illustrating a cross-sectional view of a resistive random access memory device according to example embodiments;

FIG. 2 is a diagram illustrating a cross-sectional view of a resistive random access memory device having a 1T(transistor)-1R(resistance) structure wherein a transistor has the switching structure of FIG. 1 according to example embodiments;

FIG. 3 is a graph illustrating operational characteristics of a resistive random access memory device according to example embodiments; and FIGS. 4A through 4F are diagrams illustrating a method of fabricating a resistive random access memory device according to example embodiments.

DETAILED DESCRIPTION EXAMPLE EMBODIMENTS

Figure 1:
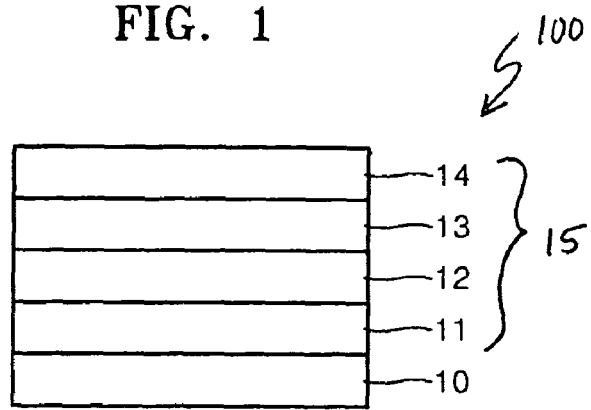
FIGS. 1-3, and 4A-4F represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a storage node, a semiconductor device and methods of manufacturing the same. Other example embodiments relate to a storage node, a resistive random access memory device including a multi-layer storage node and methods of manufacturing the same.

FIG. 1 is a cross-sectional view illustrating a resistive random access memory device 100 according to example embodiments.

Referring to FIG. 1, the resistive random access memory device 100 includes a switching structure 10 and a storage node 15 connected to the switching structure 10. The storage node 15 may include a lower electrode 11, a first layer 12, a second layer 13 and an upper electrode 14.

The switching structure 10 may have substantially the same structure as that of switching devices known in the art (e.g., a transistor or a diode). The lower electrode 11 and the upper electrode 14 may be formed of a conductive material (e.g., platinum (Pt), gold (Au), silver (Ag), tungsten (W) or the like).

The first and second layers 12 and 13 function as resistance varying layers. The first layer 12 may be formed of a compound including a metal and at least one group VI element (e.g., oxygen (O), sulfur (S), selenium (Se), tellurium (Te) and combinations thereof). For example, the first layer 12 may be formed of a compound including a transition metal and a group VI element, or a lanthanide and a group VI element. The first layer 12 may be formed of a nickel (Ni) oxide, a titanium (Ti) oxide, a zirconium (Zr) oxide, a zinc (Zn) oxide, a copper (Cu) oxide, a cesium (Ce) oxide and combinations thereof.

The second layer 13 may include at least one of copper (Cu), silver (Ag) and combinations thereof. The second layer 13 may be formed of a material having an oxidizing power (or electronegativity) less than that of the material used for forming the first layer 12. For example, if the first layer 12 includes oxygen (O), the second layer 13 may include copper (Cu) or silver (Ag) and a material having oxidizing power (or electronegativity) less than that of the oxygen (O) (e.g., sulfur (S), selenium (Se), tellurium (Te) or the like). The second layer 13 may be formed of germanium-tellurium-copper (GeTeCu).

Because the second layer 13 is formed of a material having an oxidizing power (or electronegativity) less than that of a material used for forming the first layer 12, the copper (Cu) or silver (Ag) of the second layer 13 may dissociate. As such, the storage node may have a higher on/off resistance ratio. The on/off resistance ratio of the storage node according to example embodiments may increase in comparison to a storage node having a first layer formed of germanium-tellurium (Ge—Te) and a second layer formed of copper (Cu).

Figure 2:
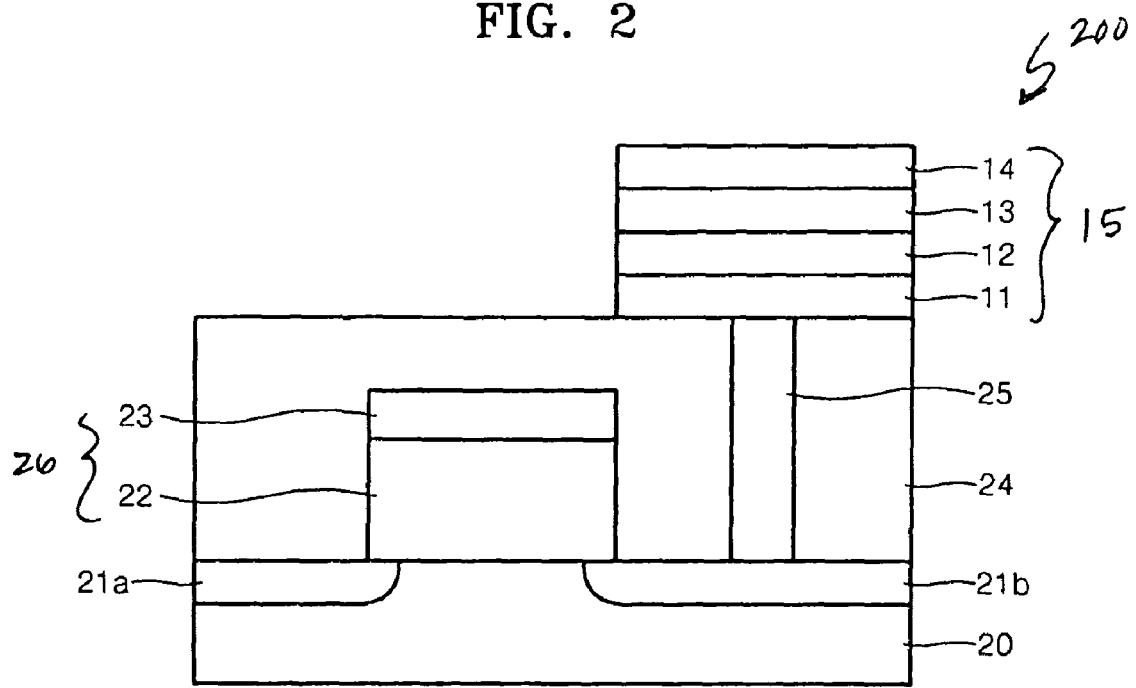

FIG. 2 is a diagram illustrating a cross-sectional view of a resistive random access memory device 200 having a 1T (transistor)-1R(resistance) structure wherein the transistor has the switching structure of FIG. 1 according to example embodiments.

Referring to FIG. 2, a semiconductor substrate 20 includes first and second impurity regions 21a and 21b. A gate insulation layer 22 and a gate electrode 23 may be sequentially formed on the semiconductor substrate 20. An interlayer insulation layer 24 may be formed on the semiconductor substrate 20 and the gate electrode 23. A conductive plug 25 may be formed through the interlayer insulation layer 24 for connecting the second impurity region 21b to a lower electrode 11.

A storage node 15 may be formed on a portion of the interlayer insulation layer 24 and over the conductive plug 25. The storage node 15 may be formed by forming a first layer 12 and a second layer 13 on the lower electrode 11. An upper electrode 14 may be formed on the second layer 13.

The first layer 12 may be formed of a metal and a material including at least one group VI element (e.g., oxygen (O), sulfur (S), selenium (Se), tellurium (Te), combinations thereof or the like). The second layer 13 may include at least one of copper (Cu), silver (Ag) and combinations thereof. The second layer 13 may include a material having an oxidizing power less than that of a material used for forming the first layer 12.

Figure 3:
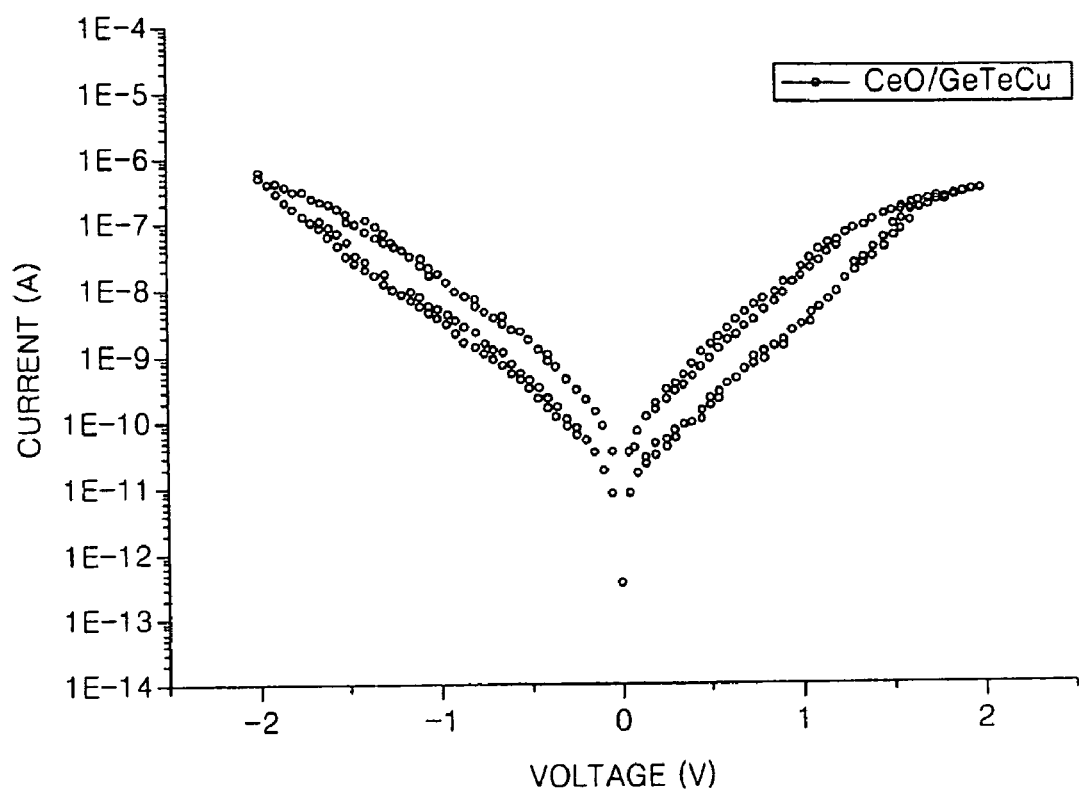

FIG. 3 is a graph illustrating voltage-current characteristics of CeO/GeTeCu layers according to example embodiments.

In FIG. 3, the horizontal axis denotes a voltage applied between a lower electrode and an upper electrode, and the vertical axis denotes a current flowing through a first layer and a second layer. The first layer is formed of a cesium (Ce) oxide (a transition metal oxide), and the second layer is formed of GeTeCu.

Referring to FIG. 3, the two current values shown are a result of the same voltage value in the range from 0 V to 2 V.

The transition metal oxide layer/GeTeCu layer structure according to example embodiments will now be discussed in comparison to a conventional GeTe layer/Cu layer structure. In the conventional GeTe layer/Cu layer structure, the resistance of the GeTe layer varies because $Cu^{2+}$ ions move (or migrate) to the GeTe layer. As such, the on/off resistance ratio of a conventional resistive random access memory device may be realized. The conventional resistive random access memory device has a narrow operational voltage range of about −0.5 V to about 0.5 V. And, it may be difficult to directly etch the copper (Cu) layer in a manufacturing process. The off resistance of the conventional resistive random access memory device varies because the phase of the GeTe layer varies with temperature.

In the resistive random access memory device according to example embodiments, the first layer may be formed in an ion transfer region using a transition metal compound including a group VI element. The second layer may be formed in an ion conductive well structure using a telluride based compound (e.g., GeTe) and copper (Cu)). The telluride based compound has an oxidizing power less than that of the first layer. The copper (Cu) may form a solid solution together with the telluride based compound (GeTe). The resistive random access memory device having the transition metal oxide layer/GeTeCu layer structure may have desired operational characteristics as shown in FIG. 3. The operational voltage and on/off resistance ratio of the resistive random access memory device according to example embodiments may be adjusted by varying the thicknesses of the transition metal oxide layer and the GeTeCu layer. It may be difficult to directly etch a copper (Cu) or a silver (Ag) layer in a manufacturing process of a conventional transition metal oxide layer. Because the telluride based compound used for forming the second layer has a higher resistance, etching may not be necessary in a manufacturing process of the transition metal oxide layer according to example embodiments.

FIGS. 4A through 4F are diagrams illustrating a method of fabricating a resistive random access memory device 200 according to example embodiments.

Figure 4A:
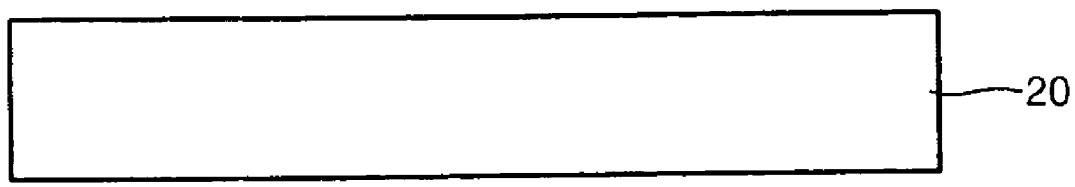

Referring to FIG. 4A, a semiconductor substrate 20 is prepared.

Figure 4B:
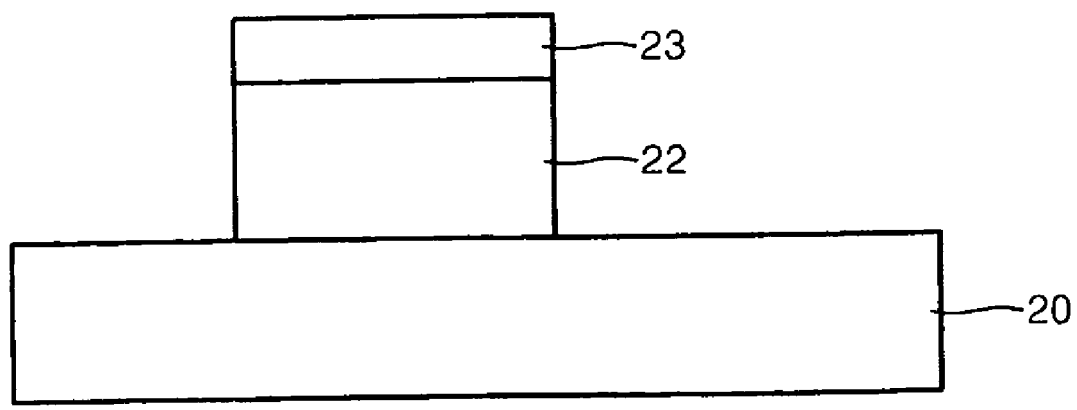

Referring to FIG. 4B, an insulation material (not shown) and a conductive material (not shown) may be sequentially deposited on the semiconductor substrate 20. The insulation and conductive materials may be etched to form a gate insulation layer 22 and a gate electrode 23.

Figure 4C:
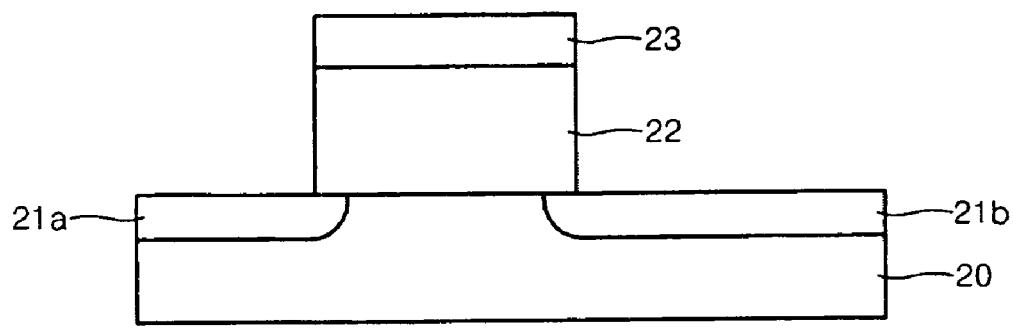

Referring to FIG. 4C, regions of the semiconductor substrate 20 adjoining both sides of the gate insulation layer 22 and the gate electrode 23 may be doped to form a first impurity region 21a and a second impurity region 21b. A transistor structure 26 may be formed on the semiconductor substrate 20.

Figure 4D:
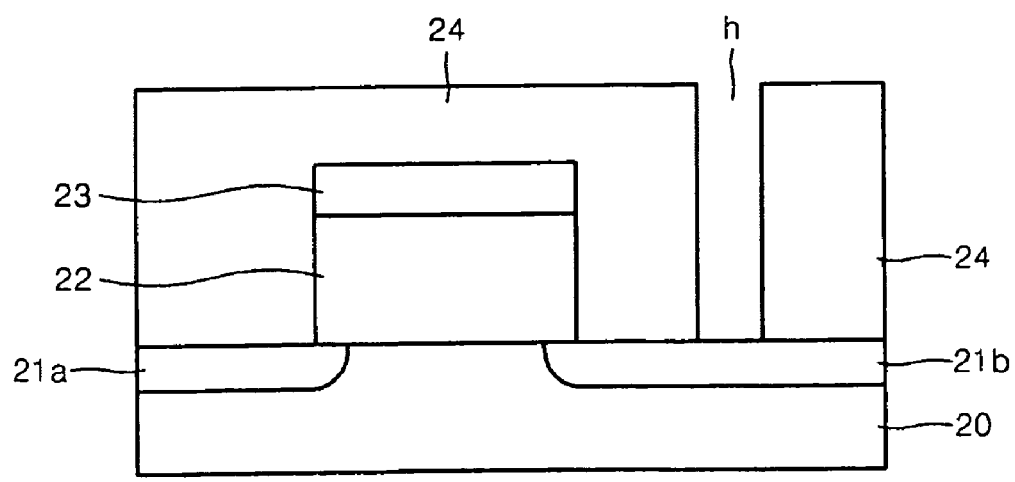

Referring to FIG. 4D, an insulation material (not shown) may be disposed (or formed) on the transistor structure 26 to form an interlayer insulation layer 24. A hole (h) may be formed through the interlayer insulation layer 24 to expose the first impurity region 21a or the second impurity region 21b.

Figure 4E:
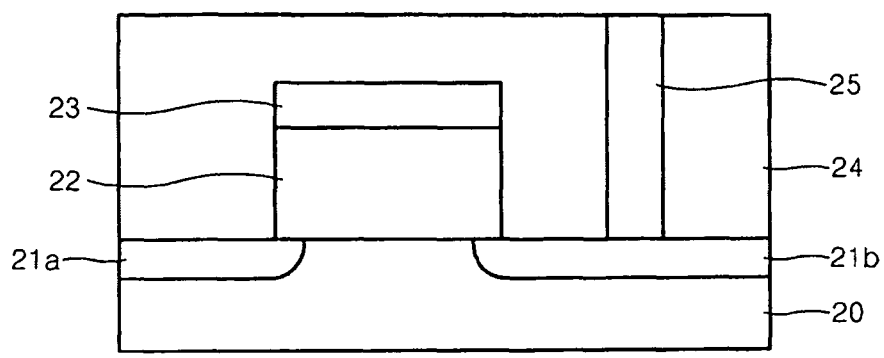

Referring to FIG. 4E, the hole (h) may be filled with a conductive material to form a conductive plug 25.

Figure 4F:
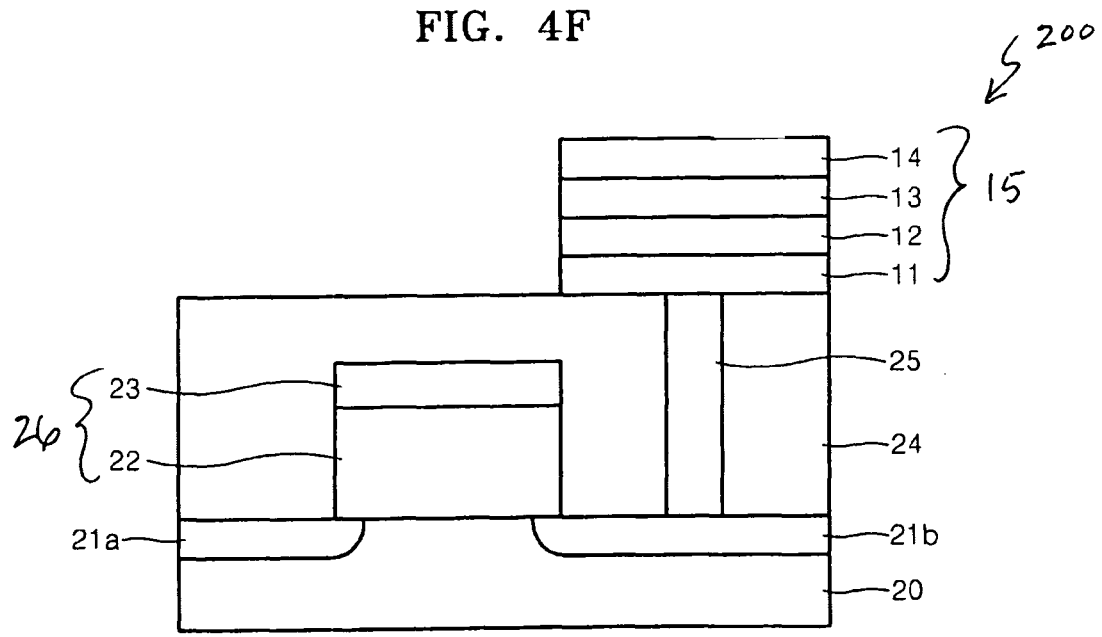

Referring to FIG. 4F, a lower electrode 11, a first layer 12, a second layer 13 and an upper electrode 14 may be sequentially formed on the conductive plug 25 to form the storage node 15.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A storage node, comprising:
    a lower electrode on a substrate;
    a first layer on the lower electrode, the first layer including at least one element selected from the group consisting of oxygen (O), sulfur (S), selenium (Se), tellurium (Te) and combinations thereof;
    a second layer on the first layer, the second layer being formed of a material having an oxidizing power less than that of the first layer and including at least one metal selected from the group consisting of copper (Cu), silver (Ag) and combinations thereof; and
    an upper electrode formed on the second layer,
    wherein the first layer is interposed between the second layer and the substrate.

2. The storage node of claim 1, wherein the first layer includes at least one metal selected from the group consisting of transition metals, lanthanides and combinations thereof.

3. The storage node of claim 2, wherein the first layer includes a transition metal oxide.

4. The storage node of claim 2, wherein the second layer includes a germanium-tellurium-copper (GeTeCu) compound.

5. The storage node of claim 1, wherein the second layer includes a germanium-tellurium-copper (GeTeCu) compound.

6. A resistive random access memory device, comprising:
a switching structure; and
the storage node according to claim 1, the storage node being connected to the switching structure.

7. The resistive random access memory device of claim 6, wherein the first layer includes at least one metal selected from the group consisting of transition metals, lanthanides and combinations thereof.

8. The resistive random access memory device of claim 7, wherein the first layer includes a transition metal oxide.

9. The resistive random access memory device of claim 7, wherein the second layer includes a germanium-tellurium-copper (GeTeCu) compound.

10. The resistive random access memory device of claim 6, wherein the second layer includes a germanium-tellurium-copper (GeTeCu) compound.

11. The resistive random access memory device of claim 6, wherein the switching structure is a diode or transistor.

12. A method of manufacturing a storage node, comprising:
forming a lower electrode on a substrate;
forming a first layer, a second layer and an upper electrode sequentially on the lower electrode, the second layer being formed of a material having an oxidizing power less than that of the first layer,
wherein the first layer includes at least one element selected from the group consisting of oxygen (O), sulfur (S), selenium (Se), tellurium (Te) and combinations thereof; and the second layer includes at least one metal selected from the group consisting of copper (Cu), silver (Ag) and combinations thereof, and the first layer is interposed between the second layer and the substrate.

13. The method of claim 12, wherein the first layer includes at least one metal selected from the group consisting of transition metals, lanthanides and combinations thereof.

14. The method of claim 13, wherein the first layer includes a transition metal oxide.

15. The method of claim 13, wherein the second layer includes a germanium-tellurium-copper (GeTeCu) compound.

16. The method of claim 12, wherein the second layer includes a germanium-tellurium-copper (GeTeCu) compound.

17. A method of manufacturing a resistive random access memory device, comprising:
forming a switching structure; and
forming a storage node according to claim 12, the storage node being connected to the switching structure.

18. The method of claim 17, wherein the switching structure is a diode or a transistor.

19. A storage node, comprising:
a lower electrode;
a first layer on the lower electrode, the first layer including a transition metal oxide;
a second layer on the first layer, the second layer including a germanium-tellurium-copper (GeTeCu) compound; and
an upper electrode formed on the second layer.

20. A method of manufacturing a storage node, comprising:
forming a first layer, a second layer and an upper electrode sequentially on a lower electrode, the second layer being formed of a material having an oxidizing power less than that of the first layer,
wherein the first layer includes a transition metal oxide, and the second layer includes a germanium-tellurium-copper (GeTeCu) compound.

* * * * *